United States Patent
Sato

(10) Patent No.: US 9,337,070 B2
(45) Date of Patent: May 10, 2016

(54) SUBSTRATE PROCESSING APPARATUS, SUBSTRATE PROCESSING METHOD AND STORAGE MEDIUM

(75) Inventor: Hideaki Sato, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 744 days.

(21) Appl. No.: 13/605,052

(22) Filed: Sep. 6, 2012

(65) Prior Publication Data

US 2013/0061888 A1   Mar. 14, 2013

(30) Foreign Application Priority Data

Sep. 9, 2011   (JP) ................................ 2011-197463

(51) Int. Cl.
*H01L 21/67*   (2006.01)

(52) U.S. Cl.
CPC .... *H01L 21/67248* (2013.01); *H01L 21/67057* (2013.01)

(58) Field of Classification Search
CPC ................................................ H01L 21/67248
See application file for complete search history.

(56) References Cited

U.S. PATENT DOCUMENTS

2009/0108486 A1*   4/2009   Babin ............................. 264/82

FOREIGN PATENT DOCUMENTS

| JP | 2005-093620 A | 4/2005 |
| JP | 2009-081366 A | 4/2009 |
| JP | 2009-253026 A | 10/2009 |
| JP | 2010-098038 A | 4/2010 |
| JP | 2010-272796 A | 12/2010 |

\* cited by examiner

*Primary Examiner* — Jason Ko
(74) *Attorney, Agent, or Firm* — Pearne & Gordon LLP

(57) ABSTRACT

A particle level varied depending on a drying processing condition can be suppressed to be stably lowered. A batch type substrate processing apparatus include a cleaning processing unit 62 having a cleaning tank 69 that stores therein a cleaning solution for cleaning a substrate, and a drying processing unit 61 disposed above the cleaning tank 69 and having a drying chamber 65 configured to perform therein a drying process on the substrate. Based on a previously investigated relationship, an internal temperature of the drying chamber is set as an internal temperature of the drying chamber when loading the substrate thereinto corresponding to the batch size of a next batch process performed in the drying chamber, and the internal temperature of the drying chamber is adjusted to be identical to the set internal temperature of the drying chamber before loading the substrate into the drying chamber.

3 Claims, 5 Drawing Sheets

SUBSTRATE PROCESSING APPARATUS, SUBSTRATE PROCESSING METHOD AND STORAGE MEDIUM

CROSS-REFERENCE TO RELATED APPLICATION

This application claims the benefit of Japanese Patent Application No. 2011-197463 filed on Sep. 9, 2011, the disclosures of which are incorporated herein by reference.

FIELD OF THE INVENTION

The present disclosure relates to a batch type substrate processing apparatus and a substrate processing method for drying a multiple number of substrates after cleaning the substrates, and also relates to a storage medium.

BACKGROUND OF THE INVENTION

Conventionally, as a substrate processing system for performing, e.g., a cleaning process on a substrate such as a semiconductor wafer (hereinafter, simply referred to as a "wafer"), there is known a batch type substrate processing system that simultaneously processes, e.g., 25 or 50 sheets of wafers as a single batch. In such a batch type substrate processing system, wafers taken out of one or two wafer containers constitutes the single batch and the single batch of wafers is transferred into various substrate processing apparatuses arranged in a processing section of the substrate processing system at one time. Then, after a series of processes are performed on the wafers, the single batch of wafers is returned back into the one or two wafer containers. A rinse process and a drying process are performed as a final process of the series of the processes performed in the processing section.

Patent Document 1, which was filed by the same applicant of the present application, describes a batch type substrate processing apparatus that performs a rinse process and a drying process consecutively. This substrate processing apparatus includes a cleaning tank and a drying chamber disposed above the cleaning tank. In the cleaning tank, the rinse process is performed by submerging a multiple number of wafers in pure water. In the drying chamber, the dry process is performed on the wafers. While the wafers lifted up from the pure water in the cleaning tank are being moved toward the drying chamber or after loaded into the drying chamber, IPA (isopropyl alcohol) vapor is discharged as a drying gas. As a result, pure water adhering on the surfaces of the wafers is substituted with IPA. Then, an $N_2$ gas as an inert gas is discharged to the wafers, so that the IPA adhering on the surfaces of the wafers is removed by the $N_2$ gas and, thus, the surfaces of the wafers are uniformly dried. Further, it is also described in Patent Document 1 that before the wafers are loaded into the drying chamber from the cleaning tank, a wall of the drying chamber is heated with a $N_2$ gas of a high temperature and, then, an internal space of the drying chamber is cooled by supplying a $N_2$ gas of a low temperature into the drying chamber. Through these processes, IPA vapor is condensed only on the surfaces of the wafers without being condensed on an inner wall surface of the drying chamber. Thus, IPA can dry the wafers efficiently and a particle level can be reduced. Even in the apparatus described in Patent Document 1, however, the particle level may become increased, though it is still within a tolerance range. As higher degree of wafer cleanness is required, there is a demand for suppressing the particle level to be stably lowered.

Patent Document 1: Japanese Patent Laid-open Publication No. 2009-253026

BRIEF SUMMARY OF THE INVENTION

In view of the foregoing, illustrative embodiments provide a drying method capable of suppressing a particle level to be stably lowered.

The present inventor has researched and found out that a variation in the particle level depends on an internal temperature of the drying chamber when the drying process is started (i.e., when substrates are loaded into the drying chamber). Further, when performing a batch type drying process, a batch size (the number of substrates simultaneously processed by a single processing) may not be a full size (e.g., 50 sheets per a single processing), but may vary depending on a processing schedule. By way of example, about 20 sheets of substrate or only a single sheet of substrate may be processed by a single processing. The present inventor found out that when a substrate having a temperature (e.g., a room temperature lower than a temperature of the internal atmosphere of the drying chamber) different from the internal temperature of the drying chamber is loaded into the drying chamber, a temperature variation of the substrate depends on the batch size. Accordingly, a condensing behavior of the drying gas on the surface of the substrate may be changed, and, thus, a drying behavior of the drying gas may also be changed. As a result, the particle level is changed. Further, the present inventor also found out that by adjusting the internal temperature of the drying chamber when the substrate is started to be loaded into the drying chamber within an optimum temperature range, the particle level can be suppressed to be stably lowered.

The present disclosure is conceived based on the aforementioned researches.

In accordance with an aspect of an illustrative embodiment, there is provided a batch type substrate processing apparatus. The batch type substrate processing apparatus includes a cleaning processing unit and a drying processing unit. The cleaning processing unit includes a cleaning tank that stores therein a cleaning solution for cleaning a substrate, and a drying processing unit is disposed above the cleaning tank. Further, the drying processing unit includes a drying chamber configured to perform therein a drying process on the substrate; a substrate holding member configured to hold the substrate in the drying chamber; a drying gas supply unit configured to supply a drying gas composed of vapor of a volatile organic solvent into the drying chamber; a temperature control gas supply unit configured to supply a heating gas or a cooling gas for controlling an internal temperature of the drying chamber into the drying chamber; a temperature sensor configured to detect the internal temperature of the drying chamber; and a controller configured to control an operation of the temperature control gas supply unit. Based on a previously investigated relationship between a batch size and an internal temperature of the drying chamber when loading the substrate thereinto, the controller is configured to set the internal temperature of the drying chamber as the internal temperature of the drying chamber when loading the substrate thereinto corresponding to the batch size of a next batch process performed in the drying chamber, and configured to control the temperature control gas supply unit to allow the internal temperature of the drying chamber to be identical to the set internal temperature of the drying chamber before loading the substrate into the drying chamber for the next batch process.

In accordance with another aspect of an illustrative embodiment, there is provided a batch type substrate processing method. The batch type substrate processing method includes performing a rinse process on a substrate; adjusting an internal temperature of a drying chamber by supplying a temperature control gas into the drying chamber; loading the substrate into the drying chamber of which internal temperature is adjusted; substituting a rinse solution adhering on the substrate with a drying gas by supplying the drying gas composed of vapor of a volatile organic solvent to the substrate; and removing the drying gas adhering on the substrate by supplying an inert gas to the substrate. In the adjusting an internal temperature of the drying chamber, based on a previously investigated relationship between a batch size and an internal temperature of the drying chamber when loading the substrate thereinto, the internal temperature of the drying chamber is adjusted to the internal temperature of the drying chamber when loading the substrate thereinto corresponding to the batch size of a next batch process performed in the drying chamber.

In accordance with still another aspect of an illustrative embodiment, there is provided a computer-readable storage medium having stored thereon a computer-executable program that, in response to execution, causes a control computer of a batch type substrate processing apparatus to perform a batch type substrate processing method as stated above. The batch type substrate processing apparatus may include a cleaning processing unit including a cleaning tank that stores therein a cleaning solution for cleaning a substrate; and a drying processing unit disposed above the cleaning tank.

In accordance with the illustrative embodiment, by loading the substrate into the drying chamber after adjusting the internal temperature of the drying chamber to a suitable temperature for the batch size of the drying process, the drying gas composed of the vapor of the volatile organic solvent can be efficiently or uniformly condensed. Thus, the efficiency and the uniformity of the drying process on the substrate can be improved, and particle generation can be suppressed to be stably lowered regardless of the batch size.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

An overall configuration of a substrate processing apparatus will be described with reference to FIG. 1. The substrate processing system shown in FIG. 1 is configured to perform a batch type cleaning process, i.e., to simultaneously perform a cleaning process on a multiple number of (e.g., about 50 sheets of) substrates such as semiconductor wafers (hereinafter, simply referred to as "wafer W").

Figure 1:
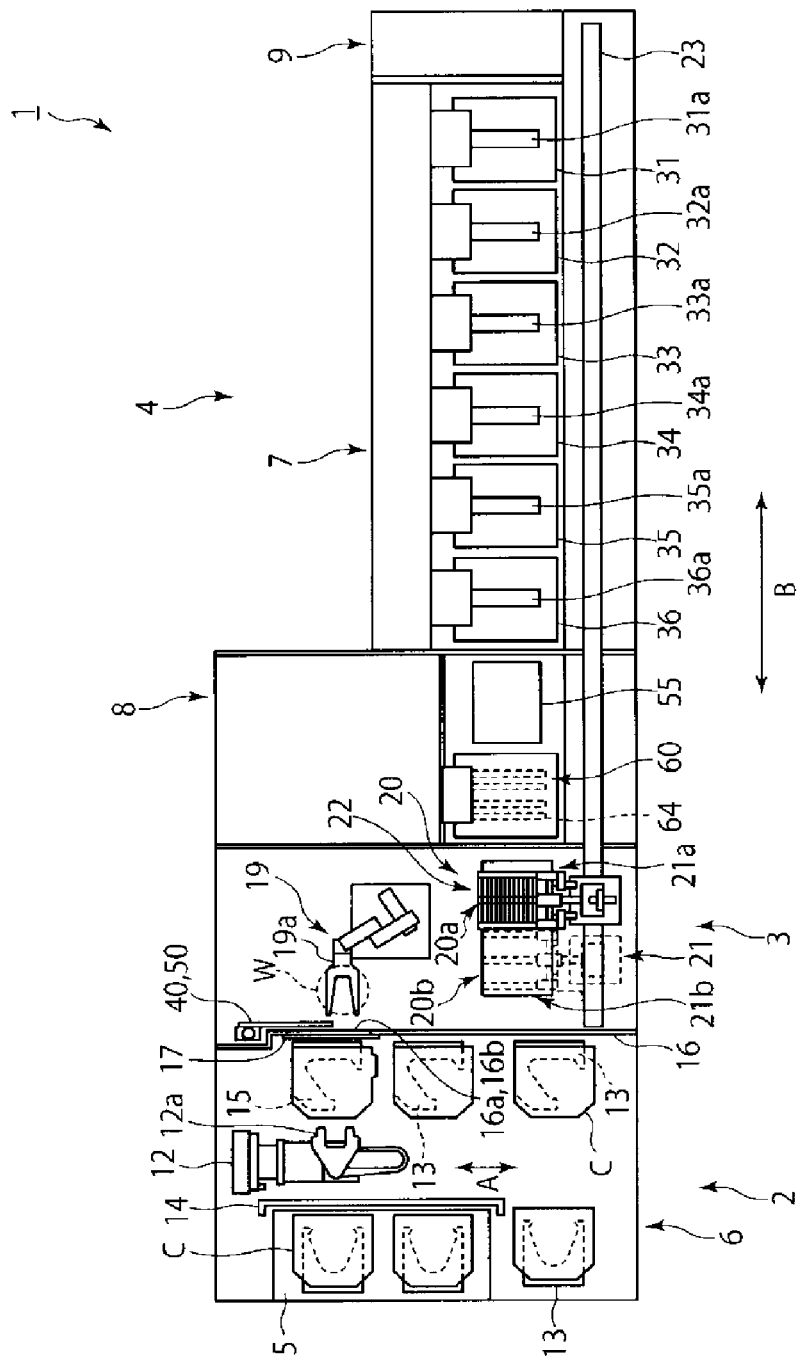
FIG. 1 is a plane view schematically illustrating a configuration of a substrate processing system including a cleaning/drying apparatus as a substrate processing apparatus.

As depicted in FIG. 1, the substrate processing system 1 includes a container loading/unloading block 2, a cleaning processing block 4 and an interface block 3. The container loading/unloading block 2 is configured to load and unload a container C for accommodating therein a multiple number of, e.g., about 25 wafers W horizontally with a certain gap therebetween in a vertical direction. The cleaning processing block 4 is configured to perform a cleaning process on the wafers W using a certain processing solution (e.g., a chemical liquid, a rinse solution, etc.) and, also, to perform a drying process after the cleaning process. The interface block 3 is configured to transfer the wafers W between the container loading/unloading block 2 and the cleaning processing block 4.

The container loading/unloading block 2 includes a container loading/unloading stage 5 for mounting thereon containers C; a container stock section 6 for storing the containers therein; and a container transferring device 12 for transferring the containers C. In the container stock section 6, a multiple number of container holding members 13 for holding the containers C are provided. Here, a FOUP (Front Open Unified Pod) may be used as a container C. As well known in the relevant art, multiple (e.g., about twenty five) slots, each for accommodating a single wafer W therein, are formed on the inner wall surface of the FOUP. Further, a front side of the FOUP serves as a loading/unloading opening for wafer W that can be opened and closed by a lid.

A shutter 14 is provided between the container loading/unloading stage 5 and the container stock section 6. When the container C is transferred from/into the container loading/unloading stage 5, the shutter 14 is opened. Except for this loading/unloading operation, the shutter 14 is kept closed.

The container stock section 6 and the interface block 3 are separated by a partition wall 16. Two openings, i.e., a lower opening 16a and an upper opening 16b, are formed at this partition wall 16 in two levels in a vertical direction (only one opening is shown in FIG. 1 since FIG. 1 provides a plane view). At the side of the container stock section 6 of the openings 16a and 16b, wafer in-and-out stages 15 are provided in two levels in the vertical direction. The wafer in-and-out stages 15 are configured to mount thereon containers C with lids of the containers C facing the openings 16a and 16b, respectively. The wafer W is unloaded from the container C through the lower opening 16a, whereas the wafer W is loaded into the container C through the upper opening 16b.

Each wafer in-and-out stage 15 is provided with a lid opening/closing device 17 for opening and closing the lid of the container C mounted thereon. The lid of the container C is opened by this lid opening/closing device 17 while the container C and the partition wall 16 are kept in firm contact with each other. As a result, the wafer W in the container C may be loaded into the interface block 3 and loaded into the empty container C from the interface block 3.

The container holding members 13 are provided in two levels in the vertical direction at a vicinity of the partition wall 16. The container stock section 6 is configured to temporarily store a container C accommodating therein the wafer W on which the cleaning process has not yet been performed. The container stock section 6 is also configured to store an empty container C from which the wafers W are taken out.

The container transferring device 12 has a multi-joint structure, and is configured to hold the container C by a supporting arm 12a provided at the leading end thereof and transfer the container C. The container transferring device 12 is configured to be movable in a height direction thereof and in a direction indicated by an arrow A of FIG. 1, and is capable of transferring the container C among the container loading/unloading stage 5, the container holding member 13, and the wafer in-and-out stage 15.

A first detector 40 provided in a vicinity of the lower opening 16a at the interface block 3 is configured to detect the wafer W in the container C before the wafer W is processed. Further, a second detector 50 provided in a vicinity of the upper opening 16b at the interface block 3 is configured to detect the wafer W in the container C after the wafer W is processed. Each of the first and second detectors 40 and 50 is composed of a multiple number of light emitting elements and light receiving elements, and is configured to detect the number of wafers W accommodated in the container C and their accommodation states (e.g., presence or absence of a wafer in each slot, misalignment of a wafer, etc.). The configuration of the first and second detectors 40 and 50 is known in the art, and a detailed configuration thereof is described in Japanese Patent Laid-open Publication No. 2010-272796 filed by the same applicant of the present application. Further, such a detecting operation for detecting the accommodation states of the wafers in the container is also referred to as "wafer mapping," and a detailed configuration and a method for wafer mapping may be adopted from various well-known configurations and methods.

The interface block 3 includes a wafer transferring device 19 for transferring and mounting the wafer W and a wafer loading/unloading unit 20.

The wafer transferring device 19 is configured to transfer and mount the wafer W from/into a container C placed on the wafer in-and-out stage 15, and also to transfer and mount the wafer W from/into a wafer arrangement device 21. The wafer transferring device 19 has a multi-axis arm structure and has a wafer holding arm 19a capable of holding thereon the same number of wafers W as that of wafers W that can be accommodated in the container C. The wafer holding arm 19a is provided at a leading end of the wafer transferring device 19 and has grip claws (not shown) for firmly holding the wafers W. While the wafers W are firmly held by the grip claws, the wafer holding arm 19a can take a certain posture and a certain position in a three-dimensional direction.

The wafer loading/unloading unit 20 has a loading position 20a and an unloading position 20b. Further, the wafer loading/unloading unit 20 includes a wafer arrangement device 21 and a wafer conveying device 22.

The wafer arrangement device 21 includes a first arrangement device 21a and a second arrangement device 21b. The first arrangement device 21a is configured to arrange non-processed 50 sheets of wafers W (corresponding to the number of wafers capable of being accommodated in two containers) at a pitch (half pitch) which is the half an arrangement pitch (normal pitch) between the wafers W in the container C. The second arrangement device 21b is configured to re-arrange processed wafers W arranged at the half pitch back to the normal pitch. The wafer arrangement device 21 is also called a "pitch changer" or the like and is well-known in the art. Thus, detailed description thereof will be omitted.

The wafer conveying device 22 includes three chucks (not shown). At each of chucks, wafer holding grooves are formed at the half pitch. The wafer conveying device 22 is configured to hold the 50 sheets of wafers W corresponding to the number of wafers capable of being accommodated in the two containers at the half pitch. The wafer conveying device 22 is movable along a guide rail 23 extended from the interface block 3 toward the cleaning processing block 4 in a direction indicated by an arrow B of FIG. 1. At the loading position 20a of the wafer loading/unloading unit 20, the wafer conveying device 22 receives the non-processed wafers W from the first arrangement device 21a of the wafer arrangement device 21. Here, the wafers W are arranged at the half pitch. Then, the wafer conveying device 22 is moved along the guide rail 23 to the cleaning processing block 4, and loads the wafers W into the cleaning processing block 4. Further, the wafer conveying device 22 unloads wafers W from the cleaning processing block 4 after a series of processes performed on the wafers W are completed. Then, the wafer conveying device 22 moves the wafers W to the unloading position 20b of the wafer loading/unloading unit and transfers the wafers W to the second arrangement device 21b of the wafer arrangement device 21 from the unloading position 20b.

The cleaning processing block 4 includes a cleaning area 7, a drying area 8 and a parking area 9. The wafer conveying device 22 transfers the wafer W among these areas.

The parking area 9 is a place where the wafer W to be processed next time stand by. During a time when a wafer is not transferred in the areas 7, 8 and 9 and among these areas, the wafer W to be processed next time is transferred into the parking area 9 from the first arrangement device 21a by the wafer conveying device 22.

In the cleaning area 7, as depicted in FIG. 1, a first chemical liquid tank 31, a first water washing tank 32, a second chemical liquid tank 33, a second water washing tank 34, a third chemical liquid tank 35 and a third water washing tank 36 are arranged in this sequence from the parking area 9.

The first chemical liquid tank 31 stores therein a SPM solution (a mixed solution of concentrated sulfuric acid and hydrogen peroxide water) heated to about 130° C. or thereabout in order to remove organic contaminants, metal impurity or the like on the surface of the wafer W. The second chemical liquid tank 33 stores therein a chemical liquid, e.g., a SC-1 solution (a mixed solution of ammonia, hydrogen peroxide and water) for removing a deposit such as a particle. The third chemical liquid tank 35 stores therein an etching solution for etching an oxide film formed on the surface of the wafer W, e.g., diluted hydrofluoric acid solution. Besides the diluted hydrofluoric acid solution, a mixture of fluoric acid and ammonium fluoride (i.e., buffered fluoric acid (BHF)) may also be used as the etching solution.

The chemical liquids and residues adhering to the wafer W through the chemical liquid processes in the first to the third chemical liquid tanks 31, 33 and 35 are removed in the first to the third water washing tanks 32, 34 and 36, respectively. Here, various washing methods such as an overflow rinse and a quick dump rinse may be used.

The first chemical liquid tank 31, the first water washing tank 32, the second chemical liquid tank 33, the second water washing tank 34, the third chemical liquid tank 35 and the third water washing tank 36 include transferring devices 31a, 32a, 33a, 34a, 35a and 36a, respectively. Each of these transferring devices 31a to 36a is movable between a position (processing position) within the corresponding tank and a position above the tank (where the wafer is transferred between the wafer conveying device 22 and the corresponding transferring device).

In the drying area 8, there is provided a chuck cleaning device 55 for cleaning the chucks of the wafer conveying device 22.

Figure 2:
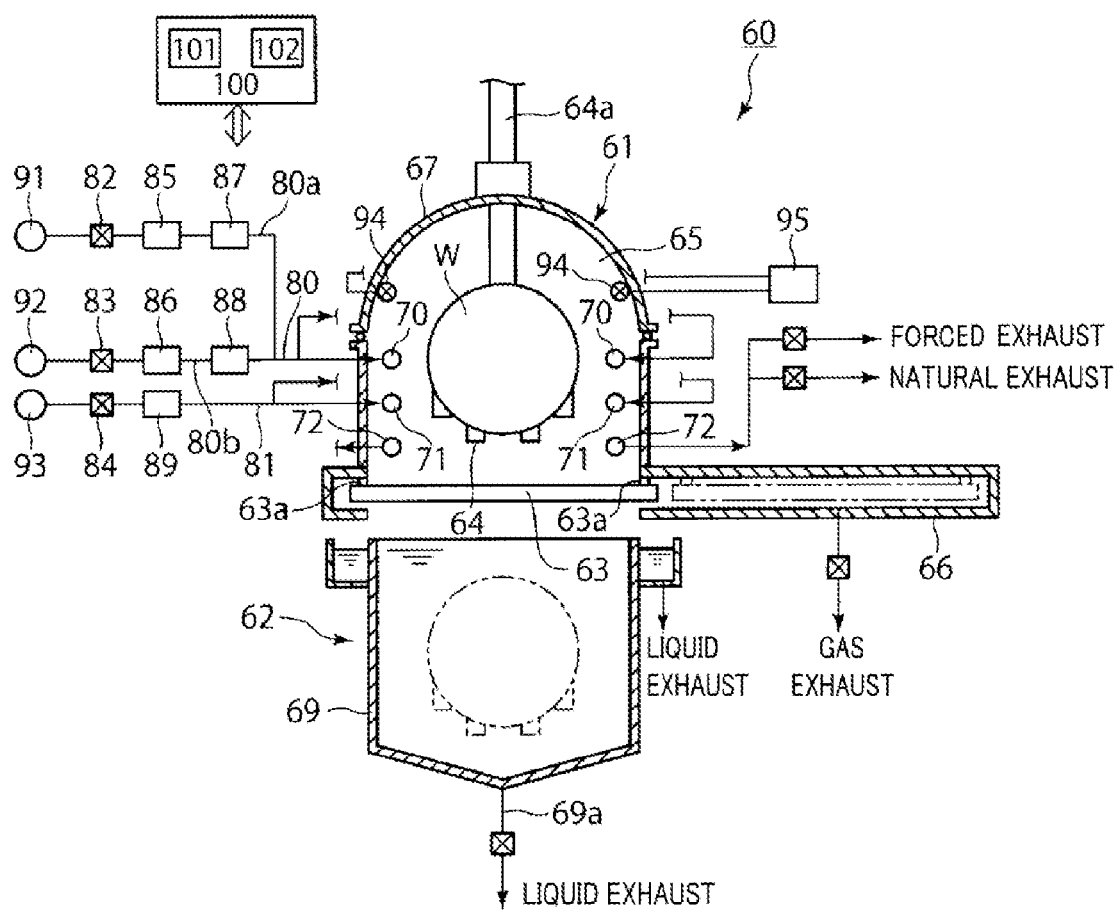
FIG. 2 is a longitudinal cross sectional view illustrating a configuration of the cleaning/drying apparatus.

As shown in FIG. 2, a cleaning/drying apparatus 60 includes a cleaning processing unit 62 configured to perform a cleaning process on a wafer W; and a drying processing unit 61 disposed above the cleaning processing unit 62 and configured to dry the wafer W cleaned in the cleaning processing unit 62. In the illustrative embodiment, the cleaning processing unit 62 is configured to perform only a rinse process on the wafer W by pure water (DIW). Further, the cleaning/drying apparatus 60 includes wafer guides (substrate holding members) 64 capable of holding the wafers W as many as carried by the wafer conveying device 22 (here, wafers W). The wafer guides 64 are configured to be movable (up and down) between the cleaning processing unit 62 and the drying processing unit 61 by an elevating device 64a. A fan filter unit (FFU, not shown) is disposed above the cleaning/drying apparatus 60, and clean air is supplied as a down flow into the cleaning/drying apparatus 60 by this fan filter unit.

The cleaning processing unit 62 includes a cleaning tank 69 that stores pure water therein. By submerging a wafer W in the pure wafer (DIW) stored in the cleaning tank 69, a pure water rinse process (cleaning process) is performed on the wafer W.

The drying processing unit 61 includes a drying chamber 65 for accommodating a wafer W therein and a chamber wall 67 that encloses the drying chamber 65.

An atmosphere of the cleaning tank 69 of the cleaning processing unit 62 (an atmosphere within the cleaning tank 69 and an atmosphere in the vicinity above the cleaning tank 69) and an atmosphere within the drying chamber 65 of the drying processing unit 61 can be isolated from and communicate with each other by a shutter 63. The shutter 63 is slidably provided in a horizontal direction. When the cleaning process is performed in the cleaning tank 69 of the cleaning processing unit 62 or when the wafer W is moved between the cleaning tank 69 and the drying chamber 65 by the wafer guide 64, the shutter 63 is accommodated in a shutter box 66. As a result, the atmosphere of the cleaning tank 69 and the atmosphere of the drying chamber 65 can communicate with each other. Meanwhile, when the shutter 63 is positioned directly under the drying chamber 65, a seal ring 63a provided on a top surface of the shutter 63 comes into contact with a bottom end of the chamber wall 67. Accordingly, a bottom opening of the drying chamber 65 is hermetically closed. It is desirable to close the shutter when there is a problem if the atmosphere within the cleaning tank 69 flows into the inside of the drying chamber 65, like the case of performing a chemical liquid process in the cleaning tank 69 as well as a pure water rinse process, as will be described later. However, when only the pure water rinse process is performed in the cleaning tank 69, the shutter 63 may be opened.

Within the drying chamber 65, there is provided a fluid nozzle 70 for supplying vapor (drying gas) of a volatile organic solvent for the drying process, e.g., IPA (isopropyl alcohol) alone or together with an inert gas such as a $N_2$ (nitrogen) gas into the drying chamber 65. The fluid nozzle 70 is connected with a pipeline 80, and the pipeline is branched into a pipeline 80a connected to a $N_2$ gas supply source 91 and a pipeline 80b connected to an IPA supply source 92. By opening an opening/closing valve 82 and operating a flow rate control valve 85 provided on the pipeline 80a, the $N_2$ gas is supplied into a heater 87 from the $N_2$ gas supply source 91 at a certain flow rate. Then, in the heater 87, the $N_2$ gas is heated, so that a hot $N_2$ gas is generated. Further, by opening an opening/closing valve 83 and operating a flow rate control valve 86 provided on the pipeline 80b, an IPA is supplied from the IPA supply source 92 into a vapor generator 88 at a certain flow rate. Then, in the vapor generator 88, the IPA is heated, so that IPA vapor is generated. The hot $N_2$ gas and the IPA vapor are discharged from the fluid nozzle 70 into the drying chamber individually or after mixed in the pipeline 80. The fluid nozzle 70 and various devices provided on the pipeline (pipelines 80a and 80b) serve as a "drying gas supply unit for supplying the drying gas composed of the vapor of the volatile organic solvent in order to dry the wafer W" and an "inert gas supply unit for supplying the inert gas in order to remove the drying gas adhering on the wafer W". Further, the fluid nozzle 70 and various devices provided on the pipeline 80 (pipelines 80a and 80b) serve as a "temperature control gas supply unit for supplying the heating gas as a temperature control gas in order to control the temperature of the drying chamber 65".

In addition, a $N_2$ gas nozzle 71 for discharging a cold $N_2$ gas (a nitrogen gas of a room temperature) into the drying chamber 65 is provided within the drying chamber 65. By opening an opening/closing valve 84 and operating a flow rate control valve 89 provided on a pipeline 81, the $N_2$ gas of a room temperature is discharged from an $N_2$ gas supply source 93 into the drying chamber 65 through the $N_2$ gas nozzle 71. The $N_2$ gas nozzle 71 and the various devices provided on the pipeline 81 serve as a "temperature control gas supply unit for supplying a cooling gas as a temperature control gas in order to control the temperature of the drying chamber 65".

Further, in the present illustrative embodiment, in order to supply the cooling gas as the temperature control gas, the $N_2$ gas nozzle 71 and the various devices on the pipeline 81 are provided separately from the fluid nozzle 70 and the various devices on the pipeline 80 (pipelines 80a and 80b). However, the illustrative embodiment is not limited thereto, and the fluid nozzle 70 and the various devices on the pipeline 80 (pipelines 80a and 80b) may be used for supplying the cooling gas as the temperature control gas. That is, after stopping the generation of the vapor of the volatile organic solvent from the vapor generator 88 and also stopping the heater 87 provided on the pipeline 80a, the cold $N_2$ gas can be discharged from the fluid nozzle 70 into the drying chamber 65. In such a case, the fluid nozzle 70 and the various devices provided on the pipeline 80 also serve as the "drying gas supply unit for supplying the drying gas composed of the vapor of the volatile organic solvent"; the "inert gas supply unit for supplying the inert gas in order to remove the drying gas adhering on the wafer W"; and the "temperature control gas supply unit for supplying the heating gas as the temperature control gas". Further, the fluid nozzle 70 and the various devices provided on the pipeline 80 also serve as the "temperature control gas supply unit for supplying the cooling gas as the temperature control gas".

Further, in the drying chamber 65, there is provided an exhaust nozzle 72 for exhausting the atmosphere within the drying chamber 65. The exhaust nozzle 72 is connected a natural exhaust line for performing an natural exhaust from the inside of the drying chamber 65 and a forced exhaust line for performing a forced exhaust from the inside of the drying chamber 65.

Furthermore, a temperature sensor 94, e.g., thermocouples, for detecting an internal temperature of the drying chamber 65 is also provided within the drying chamber 65. A detection signal from the temperature sensor 94 is converted to a temperature signal by a converter 95. Here, the term "internal temperature of the drying chamber 65" directly detected by the temperature sensor 94 typically implies a wall temperature of the drying chamber 65 (desirably, a temperature of an inner surface of the wall of the drying chamber). However, the temperature sensor 94 may be configured to detect a temperature of the atmosphere within the drying chamber 65. In such a case, by investigating a relationship between the temperature of the atmosphere within the drying chamber 65 and the wall temperature of the drying chamber 65 in advance, the wall temperature of the drying chamber 65 can be calculated based on the temperature of the atmosphere within the drying chamber 65.

The cleaning/drying apparatus 60 is operated based on a control signal of a controller (control unit) 100 which is a control computer for the cleaning/drying apparatus 60. The controller 100 controls operations of all functional elements (e.g., the arms 12a and 19a, the wafer arrangement device 21, the wafer conveying device 22, the chemical liquid tanks 31, 33 and 35, and various constituent components of the cleaning/drying apparatus 60 such as the opening/closing member of the drying chamber 65, the elevating device 64a for the wafer guide 64, the opening/closing valves 82 to 84 of the various gas supply units, the flow rate control valves 85, 86 and 89, the heater 87 and the vapor generator 88, etc.) of the substrate processing system 1. The controller 100 may be implemented by, e.g., a general-purpose computer as a hardware and a program (apparatus control programs and processing recipes) as a software for operating the computer. The software may be stored in a storage medium such as a hard disk drive fixed in the computer or may be stored in a portable storage medium such as a CD-ROM, a DVD or a flash memory set in the computer. A reference numeral 101 denotes such a storage medium. In response to an instruction from a non-illustrated user interface or the like, a processor (an operation unit) 102 retrieves a certain recipe from the storage medium 101 and executes the recipe. As a result, the individual functional elements of the substrate processing system 1 are operated under the control of the controller 100, thus performing a certain process.

Figure 3:
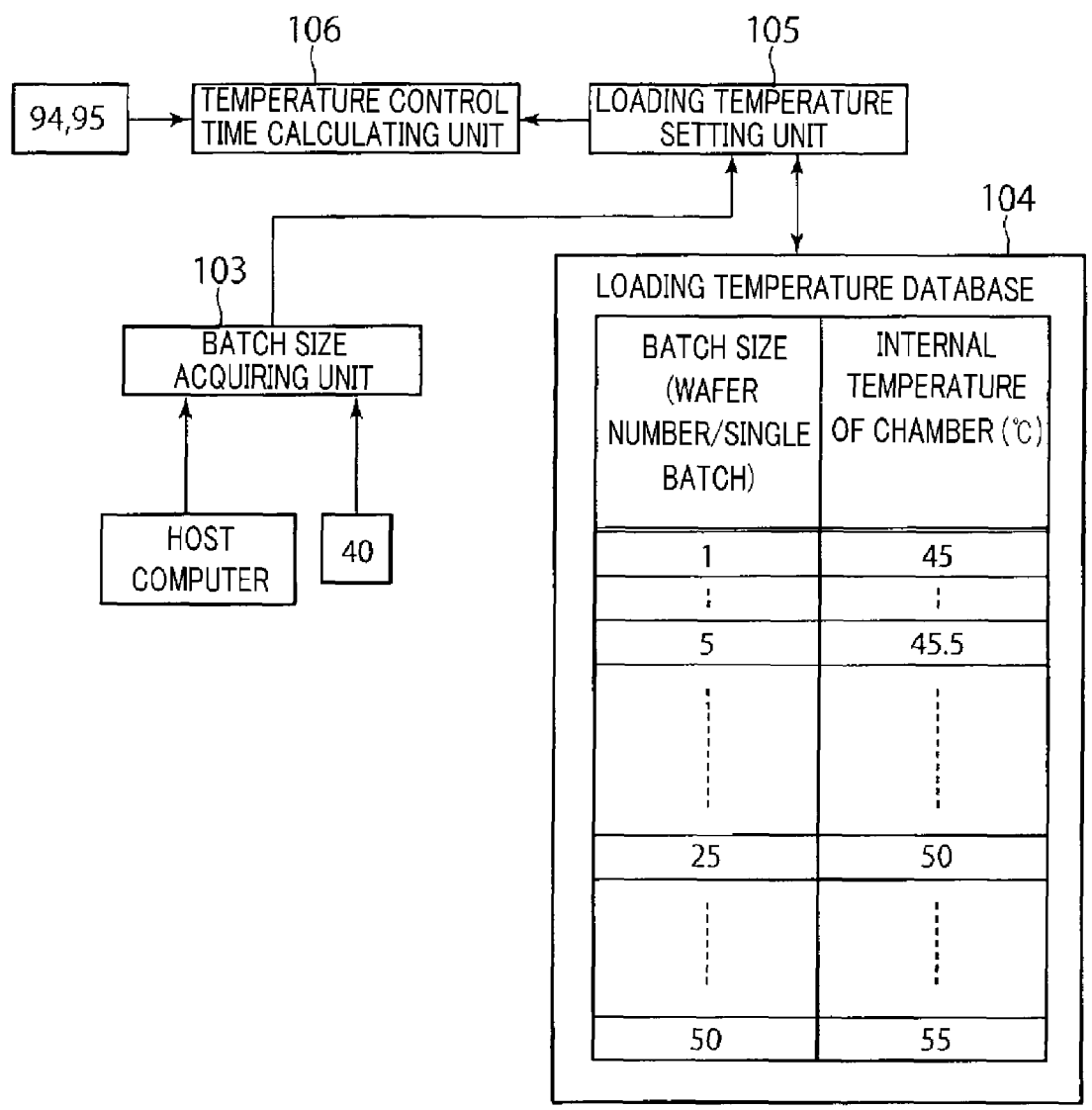
FIG. 3 is a diagram illustrating a part of a controller for setting a temperature when loading a substrate.

Among the components of the controller 100, a part related to the operation of the cleaning/drying apparatus 60 will be explained with reference to FIG. 3. The controller 100 includes a batch size acquiring unit 103. The batch size acquiring unit 103 receives data regarding a processing schedule from a host computer in a semiconductor manufacturing factory in which the substrate processing system 1 is installed. Then, from these data, the batch size acquiring unit 103 acquires a batch size (the number of wafers per a single batch) of a drying process to be performed by the cleaning/drying apparatus 60 from now on. The batch size acquiring unit 103 may determine whether the data indicating the number of the wafers received from the host computer is correct by comparing a previous detection result regarding the number of wafers W detected by the aforementioned first detector 40. Further, the batch size acquiring unit 103 may acquire a batch size of the drying process to be performed by the cleaning/drying apparatus 60 from now on based on the previous detection result of the number of wafers detected by the first detector 40.

The controller 100 also has a loading temperature database 104 in which an optimum temperature of the drying chamber 65 when loading wafers into the drying chamber 65 (simply referred to as a "loading temperature") are defined for each of various batch sizes. A relationship between a batch size and a loading temperature is expressed by a function in the form of a table or an equation (loading temperature T=f(N), N is a batch size) after obtaining a loading temperature at which the least amount of particles for each batch size are generated through experiments. FIG. 3 shows the loading temperature database 104 in the form of a table. In FIG. 3, the loading temperatures (marked by "Internal temperature of chamber" in the right column of the table within a block 104) corresponding to only batch sizes of 1, 5, 25 and 50 are specified. Actually, however, the loading temperatures corresponding to the respective batch sizes from 1 to 50 are defined. In general, as the batch size increases, the loading temperature monotonically increases, and, typically, there is established a relationship that "a loading temperature for the batch size of N" is smaller than "a loading temperature for the batch size of N+1." The reason for such a relationship between the loading temperature and the batch size is not completely explained but the present inventor has assumed as follows. That is, if a loading temperature is lower than an optimum value, when a cold wafer W (having a room temperature) is loaded, the chamber wall is deprived of heat and the temperature of the inner surface of the chamber wall decreases. As a result, the amount of IPA (drying gas) condensed on the inner surface of the chamber wall may be increased. Accordingly, a sufficient amount of IPA may not be condensed on the wafer W, and, thus, particles may be easily generated. Meanwhile, if the loading temperature exceeds the optimum value, moisture on the wafer W may be dried before a sufficient amount of IPA is condensed on the wafer W. As a result, a watermark may be formed and particles may be easily generated. Further, the optimum loading temperature for each batch size may vary depending on a volume of the drying chamber 65, a heat capacity of the chamber wall 67, and the like.

The controller 100 also includes a loading temperature setting unit 105. By referring to the loading temperature database 104, the loading temperature setting unit 105 determines the corresponding optimum loading temperature of the drying chamber 65 for the batch size obtained by the batch size acquiring unit 103. Then, the loading temperature setting unit 105 sets the determined temperature as a target value. Further, the batch size acquiring unit 103, the loading temperature database 104 and the loading temperature setting unit 105 may be implemented by a program stored in the storage medium 101 and a computer hardware composed of the processor 102, a memory (not shown), and so forth. Further, a temperature control time calculating unit 106 shown in FIG. 3 will be elaborated later.

Now, an operation of the substrate processing system 1 will be discussed.

First, the container C accommodating therein a certain number (here, 25 sheets) of wafers W is mounted on the container loading/unloading stage 5. Then, the container C on the container loading/unloading stage 5 is transferred by the container transferring device 12 onto the wafer in-and-out stage 15 for loading the wafers W. When transferring a multiple number of containers C repeatedly, it may be possible to temporarily mount the containers C on the container holding members 13 of the container stock section 6, and then, transfers the containers. Subsequently, the lid opening/closing device 17 unlocks a lock of a lid of the container C mounted on the wafer in-and-out stage 15 and opens the lid. Then, the first detector 40 detects the wafers W within the container C through the opening 16a of the partition wall 16.

After the first detector 40 detects the wafers W within the container C, the wafer holding arm 19a of the wafer transferring device 19 is inserted into the container C on the wafer in-and-out stage 15 through the opening 16a. The wafer holding arm 19a takes out the wafers W from the container C and transfers the wafers W to the first arrangement device 21a of the wafer arrangement device 21. Concurrently with this operation, the lid opening/closing device 17 closes the lid of the empty container C on the wafer in-and-out stage 15 from which the wafers W have been taken out, and, then, the empty container C is transferred to one of the container holding members 13 by the container transferring device 12. During this operation, the opening 16a is closed.

Thereafter, a next container C (assume that 25 sheets of wafers W are also accommodated in here) on the container loading/unloading stage 5 is transferred onto the wafer in-and-out stage 15 for loading the wafers W by the container transferring device 12. Then, the lid opening/closing device 17 unlocks a lock of a lid of the container C mounted on the wafer in-and-out stage 15 and opens the lid. Thereafter, the first detector 40 detects the wafers W within the container C through the opening 16a of the partition wall 16. Then, the wafers W within the container C are taken out by the wafer holding arm 19a of the wafer transferring device 19 and are transferred to the first arrangement device 21a. At this time, the first arrangement device 21a becomes to hold the 50 sheets of wafers W at the half pitch. The first arrangement device 21a transfers the 50 sheets of wafers W to the wafer conveying device 22.

The wafers W transferred to the wafer conveying device 22 are transferred together into the cleaning processing block 4, and a series of cleaning processes are performed.

The wafers W are first moved to a position above the first chemical liquid tank 31 by the wafer conveying device 22. From there, the wafers W are transferred to the transferring device 31a and a chemical liquid process is performed on the wafers W in the first chemical liquid tank 31. Thereafter, the wafers W are moved up to the position above the first chemical liquid tank 31 by the transferring device 31a and transferred to the wafer conveying device 22 from there. Subsequently, the wafers W are moved to a position above the first water washing tank 32 by the wafer conveying device 22. From there, the wafers W are transferred to the transferring device 32a and a rinse process is performed on the wafers W in the first water washing tank 32. Likewise, liquid processes are performed on the wafers W in the second chemical liquid tank 33, the second water washing tank 34, the third chemical liquid tank 35 and the third water washing tank 36 in this sequence.

After the cleaning process is ended in the cleaning area 7, the wafers W are transferred to the wafer conveying device 22 and then loaded into the cleaning/drying apparatus 60 in the drying area 8. In the cleaning/drying apparatus 60, a rinse process (cleaning process) and a drying process are subsequently performed.

Figure 4:
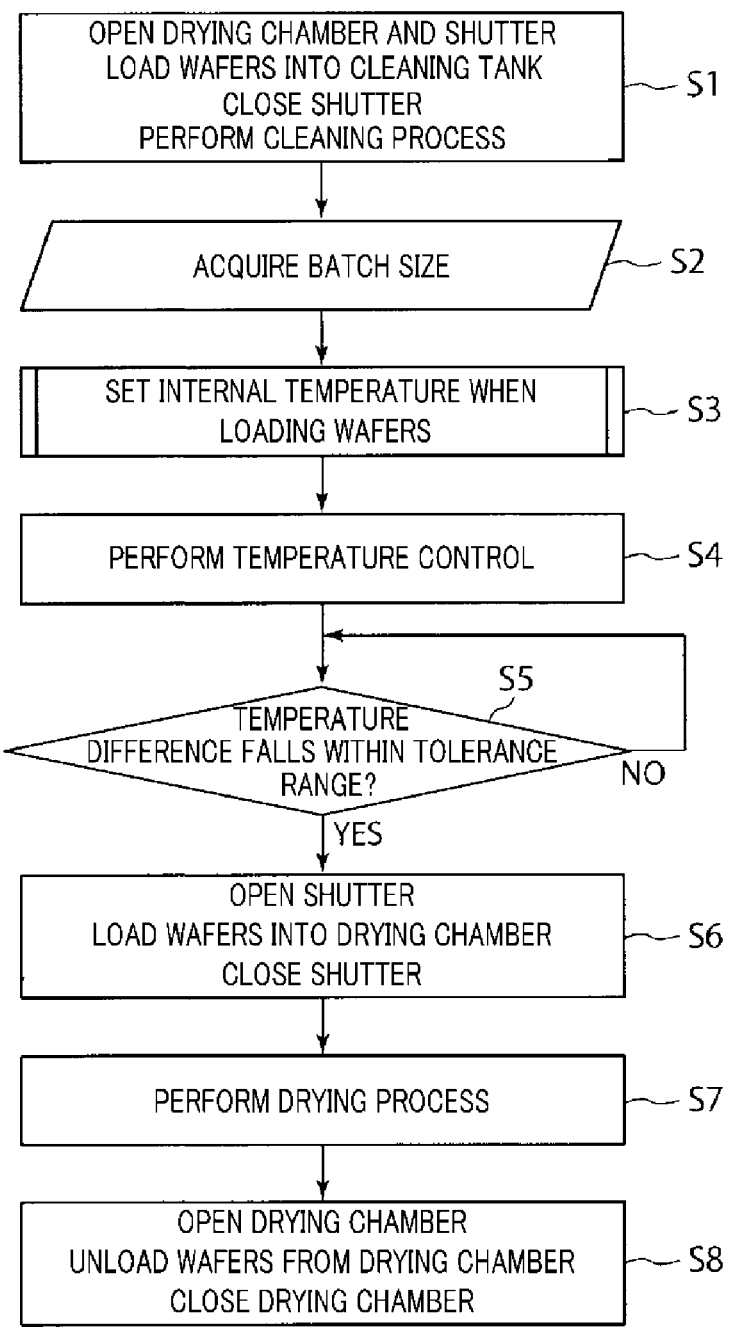
FIG. 4 is a flowchart for describing an example of a series of processes performed in the cleaning/drying apparatus.

Now, a series of operations performed by the cleaning/drying apparatus 60 will be explained with reference to a flowchart of FIG. 4.

First, the wafer guide 64 is located within the drying chamber 65 of the drying processing unit 61. In this state, the drying chamber 65 of the drying processing unit 61 is opened, and the 50 sheets of wafers W are transferred from the wafer conveying device 22 to the wafer guide 64. Then, the wafer guide 64 is moved down and the wafers W held thereon are submerged in pure water in the cleaning tank 69. Then, the shutter 63 is closed. By supplying pure water into the cleaning tank 69, the pure water is overflown from the cleaning tank 69, so that a pure water rinse process is performed on the wafers W (Step S1).

Immediately after the shutter 63 is closed, a temperature control for the drying chamber 65 is started. In the temperature control, the controller 100 receives data from the batch size acquiring unit 103. Here, the data indicate the number of wafers W (i.e., a batch size) accommodated in the cleaning tank 69 from the host computer in the semiconductor manufacturing factory or from the record of the detection result of the first detector 40 (step S2). Then, under the control of the controller 100, the loading temperature setting unit 105 sets the loading temperature of the inside of the drying chamber 65 (i.e., an internal temperature of the drying chamber when a substrate is loaded) based on the loading temperature database 104 (step S3). By way of example, when the batch size is 50 sheets, the loading temperature may be set to, e.g., about 55° C., as shown in FIG. 3. Further, the steps S2 and S3 may be performed before or concurrently with the step S1.

Thereafter, based on the set loading temperature of the drying chamber 65, the temperature of the inside of the drying chamber 65 is adjusted (step S4). In this temperature control, the controller 100 compares a temperature (hereinafter, simply referred to as an "actual temperature Ta") within the drying chamber 65 detected by the temperature sensor 94 and the set loading temperature of the drying chamber (hereinafter, simply referred to as a "set temperature Ts") set by the loading temperature setting unit 105. If the actual temperature Ta is lower than the set temperature Ts, a hot $N_2$ gas, whose temperature is adjusted to, e.g., about 60° C. to about 70° C., is discharged into the drying chamber 65 from the fluid nozzle 70. As a result, the inside of the drying chamber 65 is heated. If the actual temperature Ta is much lower than the set temperature Ts, the IPA vapor, whose temperature is adjusted to, e.g., about 70° C. to about 80° C., may also be discharged into the drying chamber 65 in addition to the hot $N_2$ gas.

Meanwhile, if the actual temperature Ta is higher than the actual temperature Ts, a cold $N_2$ gas (having a room temperature (substantially the same as an internal temperature of a clean room)) is discharged into the drying chamber 65 from the $N_2$ gas nozzle 71. As a result, the inside of the drying chamber 65 is cooled. The temperature control for the inside of the drying chamber 65 may be performed by varying a temperature control time while using the temperature control gases of certain temperatures and certain flow rates. Here, since a temperature increasing speed of the actual temperature Ta varies depending on the temperatures and the flow rates of the temperature control gases (hot $N_2$ gas and IPA vapor), the temperature of the inside of the drying chamber 65 may also be controlled by adjusting, for example, opening degrees of the flow rate control valves 85 and 86, heating temperatures of the heater 87 and the vapor generator 88 and a switchover between the natural exhaust and forced exhaust from the exhaust nozzle 72. Likewise, since a temperature decreasing speed of the actual temperature Ta varies depending on a flow rate of the temperature control gas (cold $N_2$ gas) (in this case, a temperature is controlled to be constant at a room temperature), the temperature of the inside of the drying chamber 65 may be controlled by adjusting an opening degree of the flow rate control valve 89 and a switchover between the natural exhaust and forced exhaust from the exhaust nozzle 72.

If the actual temperature Ta becomes equal to the set temperature Ts or if a difference between the actual temperature Ta and the set temperature Ts falls within a tolerance range (e.g., about ±1° C.) (Yes in step S5), a drying process is ready to be started. At this time, if the cleaning process in the cleaning tank 69 has been finished, the drying process is immediately stared. On the other hand, if the cleaning process in the cleaning tank 69 has not been finished yet, the aforementioned temperature control operation is continuously performed until the cleaning process in the cleaning tank 69 is finished. Then, upon the completion of the cleaning process in the cleaning tank 69, the drying process is immediately started.

When performing the drying process, the shutter 63 that isolates the drying chamber 65 and the cleaning tank 69 is opened, and an atmosphere of the IPA vapor is generated in the drying chamber 65 and above the cleaning tank 69 by supplying the IPA vapor, of which temperature is adjusted to, e.g., about 70° C. to about 80° C., into the drying chamber 65. In this state, the wafer guide 64 is moved upward and the wafers W are also moved up to a position where the wafers W are accommodated in the drying chamber 65 (step S6). Subsequently, by closing the shutter 63, the cleaning tank 69 and the drying chamber 65 are isolated. Then, the IPA vapor is continuously supplied into the drying chamber 65 for a certain period of time. As a result, the pure water adhering on the surfaces of the wafers W is substituted with IPA.

If a liquid film of IPA is formed on the surfaces of the wafers W by supplying the IPA vapor for the certain period time, the supply of the IPA vapor into the drying chamber 65 is stopped. Then, the IPA is removed from the surfaces of the wafers W. By way of example, the IPA may be removed by volatilizing or evaporating the IPA from the surfaces of the wafers W while supplying the $N_2$ gas heated to, e.g., about 40° C. to about 50° C. into the drying chamber 65; and by cooling the wafers W to a preset temperature while supplying the $N_2$ gas of a room temperature into the drying chamber 65. Through these processes, the drying process performed on the wafers W is finished (step S7).

The wafers W on which the drying process is performed are vertically mounted on the wafer conveying device 22. Here, the wafers W, e.g., 50 sheets of wafers W are mounted in the upright posture at the half pitch. In this state, the wafers W are transferred to the unloading position 20b of the interface block 3 by the wafer conveying device 22.

After transferred to the unloading position 20b, the wafers W are transferred to the second arrangement device 21b of the wafer arrangement device 21 while still arranged at the half pitch. At this time, the second arrangement device 21b is operated to re-arrange the wafers W at the normal pitch. That is, for example, two sets of 25 sheets of wafers W are held together to be accommodated in two containers, respectively.

Thereafter, an empty container C is mounted on the wafer in-and-out stage 15 by the container transferring device 12, and the lid opening/closing device 17 opens a lid of the empty container C. Then, after a preparatory operation of the wafer transferring device 19 is performed, the wafer holding arm 19a is inserted into the second arrangement device 21b of the wafer arrangement device 21 and takes out the wafers W held therein in the upright posture. Thereafter, the wafer holding arm 19a holding the wafers W thereon is inserted into the empty container C on the wafer in-and-out stage 15 through the opening 16b of the partition wall 16, and the wafers W are loaded into the container C in the horizontal posture. Thereafter, the wafer holding arm 19a is retreated from the container C, and the second detector 50 detects the wafers W within the container C through the opening 16b of the partition wall 16.

After the second detector 50 detects the states of the wafers W within the container C, the lid opening/closing device 17 closes the lid of the container C. Then, the container C accommodating therein the wafers W on which the drying process is performed is transferred to the container loading/unloading stage 5 by the container transferring device 12. Through these processes, the series of processes in the substrate processing system 1 are ended.

In accordance with the above-described illustrative embodiment, by adjusting the internal temperature of the drying chamber 65 to a certain temperature for a batch size before the wafers W are transferred into the drying chamber 65, it is possible to prevent the wafers W from being dried non-uniformly and to reduce particle generation on the surfaces of the wafers W.

The above-described illustrative embodiment may be modified as follows, for example.

In accordance with the aforementioned illustrative embodiment, only a pure water rinse process is performed in the cleaning tank 69 of the cleaning processing unit 62. However, by adding a structure (chemical liquid supply device) capable of supplying a chemical liquid (e.g., DHF, APF, or SPM) into the cleaning processing unit 62, it may be possible to allow the cleaning/drying apparatus 60 to take a part of the liquid processes performed by the first to the third chemical liquid tanks 31, 33 and 35 as stated above. In such a case, after at least one kind of chemical liquid process is performed on the wafers W within the cleaning tank 69, the chemical liquid in the cleaning tank 69 is substituted with pure water (DIW) and a pure water rinse process is performed on the wafers W, subsequently. Thereafter, the wafers W are transferred into the drying chamber 65 of the drying processing unit 61 and the drying process is performed on the wafers W. In this case, a time interval between when the shutter 63 is closed after the wafers W are loaded into the cleaning tank 69 and when the shutter 63 is opened again to transfer the wafers W from the cleaning tank 69 into the drying chamber 65 is lengthened. Accordingly, the temperature control of the drying chamber 65 can be performed for a sufficient time. Thus, a burden or a load on the components involved in the temperature control can be reduced. Further, cost for the temperature control can be reduced. By way of example, power consumption can be reduced by controlling the temperature of the hot $N_2$ gas to be low. Moreover, the consumption of the $N_2$ gas can be reduced by decreasing the flow rate of the hot $N_2$ gas (or cold $N_2$ gas). Furthermore, a high price of IPA need not be used for the temperature rise.

In the above-stated illustrative embodiment, the temperature control of the drying chamber 65 is started after the wafers W are loaded into the cleaning tank 69 and the shutter 63 is closed. However, the temperature control of the drying chamber 65 may be performed even before the wafers W are loaded into the cleaning tank 69. In this case, if the drying chamber 65 is opened when the wafers W are loaded thereinto, most of the atmosphere within the drying chamber 65 may be exhausted to the outside. However, since the chamber wall 67 has a heat capacity, some of the temperature control effect may still remain. Accordingly, the time period required for the temperature control performed after loading the wafers W can be shortened. Especially, it is advantageous to adopt this processing sequence when a difference between the actual temperature Ta and the set temperature Ts is large. In such a case, the flowchart of FIG. 4 may be changed to the sequence of steps S2→S3→S4→S1→S4 (after the second step S4, the sequence is the same as depicted in FIG. 4).

In the above-described illustrative embodiment, the end of the temperature control is determined based on the comparison of the set temperature Ts and the actual temperature Ta detected by the temperature sensor 94 in a real time mode. However, the illustrative embodiment may not be limited thereto. If a difference between the set temperature Ts and an initial actual temperature Ta can be acquired, the time period required for supplying the temperature control gas can be calculated based on a relationship previously investigated through experiments. In such a case, the end of the temperature control may be determined after the temperature control gas is supplied for the calculated time period. A unit for calculating the time period required for supplying the temperature control gas is depicted as the temperature control time calculating unit 106 in FIG. 3.

Figure 5:
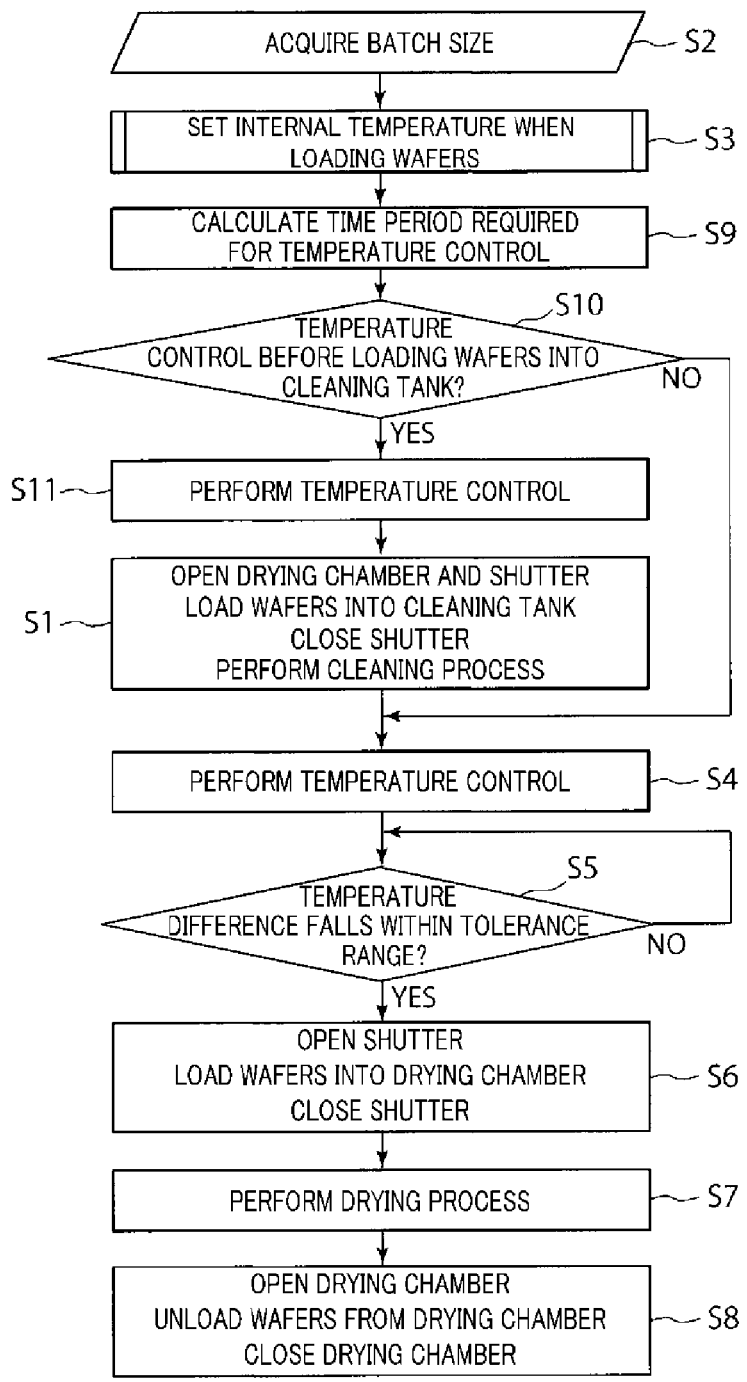
FIG. 5 is a flowchart for describing a modification example of a series of processes performed in the cleaning/drying apparatus.

Further, if the time period required for supplying the temperature control gas is longer than that required for performing the cleaning process in the cleaning tank 69, it is desirable to start the temperature control of the drying chamber 65 before the step S1, as mentioned above. Thus, it is desirable to start the steps S2 and S3 after wafers W on which a certain batch process has been performed is completely unloaded from the drying chamber 65 and before wafers W to be subjected to a batch process next are loaded into the cleaning tank 69. A flowchart for this case is shown in FIG. 5. Here, only the difference from the flowchart in FIG. 4 will be briefly explained. In the flowchart of FIG. 5, the same step numbers as those in FIG. 4 indicate same operations, and, thus, redundant description thereof will be omitted. If the time period required for the temperature control (i.e., the time period required for supplying the temperate control gas) is calculated in step S9, it is determined whether it is desirable to perform the temperature control of the drying chamber 65 before loading wafers W into the cleaning tank 69 by comparing the time period required for the temperature control and the time period required for performing the cleaning process in the cleaning tank 69 (here, the time period required for performing the cleaning process implies the time between when the wafers W are loaded into the cleaning tank 69 and the shutter 63 is closed and when the shutter 63 is opened again for transferring the wafers W) (step S10). If the time period required for the temperature control is longer than the time period required for performing the cleaning process, the wafers W need to stand by in the cleaning tank until the temperature control is finished even after completing the cleaning process. However, it is desirable to prevent the wafers W from being left in the cleaning tank 69 after the cleaning process since this may have a negative effect on a throughput. Accordingly, if it is determined in step S10 that "it is desirable (necessary) to perform the temperature control before loading the wafers W" (Yes in step S10), the temperature control of the drying chamber 65 is performed before the wafers W are loaded into the cleaning tank 69 (step S11). If it is determined in step S10 that it is not necessary to perform the cleaning process before loading the wafers W (No in step S10), the temperature control of the drying chamber 65 is not performed before the wafers W are loaded into the cleaning tank 69, but performed after the wafers W are loaded in the cleaning tank 69 (step S4).

Further, depending on a processing schedule, there may be a long time interval between batch processes. In such a case, if the internal temperature of the drying chamber 65 is reduced to near a room temperature, it takes a long time to increase the temperature again. To prevent this problem, it may be desirable to supply a heating gas, especially, the hot $N_2$ gas to prevent the internal temperature of the drying chamber 65 from being decreased below a certain level.

In the above-described illustrative embodiment, the fluid nozzle 70 and the $N_2$ gas nozzle 71 used for supplying the gases toward the wafers W accommodated in the drying chamber 65 are also used for the temperature control of the drying chamber 65. Further, it may be possible to provide one or more nozzles for discharging a gas toward the chamber wall 67 in order to heat or cool the chamber wall 67 efficiently. A device for supplying the gas to these nozzles may be the same as or different from the devices for supplying the gases to the fluid nozzle 70 and the $N_2$ gas nozzle 71.

In the above-described illustrative embodiment, when cooling the drying chamber 65, the $N_2$ gas having a room temperature (substantially equal to an internal temperature of a clean room) from the $N_2$ gas nozzle 71. However, it may be possible to supply the $N_2$ gas cooled by a cooling device into the drying chamber 65 through other $N_2$ gas nozzles.

What is claimed is:
1. A batch type substrate processing apparatus comprising:
a cleaning processing unit including a cleaning tank that stores therein a cleaning solution for cleaning a substrate; and
a drying processing unit disposed above the cleaning tank,
wherein the drying processing unit comprises:
a drying chamber configured to perform therein a drying process on the substrate;
a substrate holding member configured to hold the substrate in the drying chamber;
a drying gas supply unit configured to supply a drying gas composed of vapor of a volatile organic solvent into the drying chamber;
a temperature control gas supply unit configured to supply a heating gas or a cooling gas for controlling an internal temperature of the drying chamber into the drying chamber;
a temperature sensor configured to detect the internal temperature of the drying chamber; and
a controller configured to control an operation of the temperature control gas supply unit,
wherein the controller includes: a batch size acquiring unit that acquires a batch size of the drying process to be performed; and a loading temperature database that stores therein target internal temperatures of the drying chamber corresponding to respective batch sizes, and
the controller is configured to set a target internal temperature of the drying chamber based on the batch size acquired in the batch size acquiring unit and a corresponding target internal temperature of the drying chamber that corresponds to the batch size and which is stored in the loading temperature database, and the controller is configured to control the temperature control gas supply unit to allow an internal temperature of the drying chamber to be identical to the target internal temperature of the drying chamber before loading the substrate into the drying chamber for a next batch process.

2. The substrate processing apparatus of claim 1, further comprising:
an inert gas supply unit configured to supply an inert gas for removing the drying gas adhering on the substrate into the drying chamber,
wherein at least one of the drying gas supply unit and the inert gas supply unit serves as at least a part of the temperature control gas supply unit.

3. The substrate processing apparatus of claim 1,
wherein the controller is configured to calculate a time period required for temperature control based on a difference between an actual internal temperature of the drying chamber detected by the temperature sensor and the target internal temperature of the drying chamber, and configured to determine a starting time of the temperature control based on the calculated time period.

* * * * *